United States Patent
Adler et al.

(10) Patent No.: US 6,836,440 B2
(45) Date of Patent: Dec. 28, 2004

(54) METHOD OF CHECKING ELECTRICAL CONNECTIONS BETWEEN A MEMORY MODULE AND A SEMICONDUCTOR MEMORY CHIP

(75) Inventors: Frank Adler, München (DE); Thomas Huber, München (DE); Manfred Moser, Dachau (DE)

(73) Assignee: Infineon Technologies AG, Munich (DE)

( * ) Notice: Subject to any disclaimer, the term of this patent is extended or adjusted under 35 U.S.C. 154(b) by 121 days.

(21) Appl. No.: 10/356,921

(22) Filed: Jan. 30, 2003

(65) Prior Publication Data

US 2003/0169633 A1 Sep. 11, 2003

(30) Foreign Application Priority Data

Jan. 30, 2002 (DE) .......................................... 102 03 570

(51) Int. Cl.$^7$ .......................... G11C 29/00; G01R 31/28

(52) U.S. Cl. ...................................... 365/201; 714/730

(58) Field of Search ............................ 365/201, 230.02, 365/200; 714/726, 730

(56) References Cited

U.S. PATENT DOCUMENTS 5,377,199 A * 12/1994 Fandrich ...................... 714/726
6,163,867 A * 12/2000 Miller et al. ................. 714/736

FOREIGN PATENT DOCUMENTS

DE          40 01 563 A1     7/1991

* cited by examiner

Primary Examiner—Richard Elms
Assistant Examiner—J. H. Hur
(74) Attorney, Agent, or Firm—Laurence A. Greenberg; Werner H. Stemer; Gregory L. Mayback (57) ABSTRACT

Two methods check functional capability of electrical connections between address lines of a printed circuit board of a memory module and address line contacts of an integrated semiconductor memory chip mounted on the printed circuit board. Ruptured solder contacts are conventionally examined optically or investigated by electrical resistance measurements; however, the latter do not work in the case of memory modules with a number of semiconductor chips, the pin contacts of which are connected in parallel by the address lines. The methods make it possible to locate interrupted contacts on individual address lines by the indirect use of a write-read access to the semiconductor memory chip, specifically utilizing the misrouting of writing and reading commands produced by defective contact connections.

18 Claims, 6 Drawing Sheets

Carrying out steps a) to d), in step b) the address line L1 being biased as the single address line.

↓

Repeating steps a) to d), in step b) the address line L2 being biased as the single address line.

↓

Repeating steps a) to d), in step b) the address line L3 being biased as the single address line.

↓

Repeating steps a) to d), in step b) the address line L4 being biased as the single address line.

↓

Repeating steps a) to d), in step b) the address line L5 being biased as the single address line.

↓

Repeating steps a) to d), in step b) the address line L6 being biased as the single address line.

FIG. 3C

Carrying out steps a) to d), in step a) the address line L1 being biased as the single address line.

↓

Repeating steps a) to d), in step a) the address line L2 being biased as the single address line.

↓

Repeating steps a) to d), in step a) the address line L3 being biased as the single address line.

↓

Repeating steps a) to d), in step a) the address line L4 being biased as the single address line.

↓

Repeating steps a) to d), in step a) the address line L5 being biased as the single address line.

↓

Repeating steps a) to d), in step a) the address line L6 being biased as the single address line.

FIG 4

| V (L) | | L1 | L2 | L3 | L4 | L5 | L6 |
|---|---|---|---|---|---|---|---|
| a) | x | 0 | 0 | V | 0 | 0 | 0 |
|    | y | 0 | 0 | 0 | 0 | 0 | 0 |
| b) | x | 0 | 0 | 0 | 0 | 0 | 0 |
|    | y | 0 | 0 | 0 | 0 | 0 | 0 |
| c) | x | 0 | 0 | V | 0 | 0 | 0 |
|    | y | 0 | 0 | 0 | 0 | 0 | 0 |
| a*) | x | 0 | 0 | 0 | 0 | V | 0 |
|     | y | 0 | 0 | 0 | 0 | 0 | 0 |
| b*) | x | 0 | 0 | 0 | 0 | 0 | 0 |
|     | y | 0 | 0 | 0 | 0 | 0 | 0 |
| c*) | x | 0 | 0 | 0 | 0 | V | 0 |
|     | y | 0 | 0 | 0 | 0 | 0 | 0 |

FIG 5

| V (L) | L1 | L2 | L3 | L4 | L5 | L6 | |
|---|---|---|---|---|---|---|---|
| V (BTL) | 0 | 0 | 0 | 0 | V | 0 | BTL=1 |
| V (BTP) | 0 | 0 | 0 | 0 | V | 0 | BTP=sequ. |
| V (CAS) | 0 | 0 | 0 | 0 | V | 0 | CAS=2 |

METHOD OF CHECKING ELECTRICAL CONNECTIONS BETWEEN A MEMORY MODULE AND A SEMICONDUCTOR MEMORY CHIP

BACKGROUND OF THE INVENTION

Field of the Invention

The invention relates to a method for checking the functional capability of electrical connections between address lines of a printed circuit board of a memory module and address line contacts of an integrated semiconductor memory chip mounted on the printed circuit board. The memory addresses of the chip can be selected by address lines electrically biased in a specific manner.

Methods of this type are used in the event of failure of individual memory chips on a memory module, for example a dual inline memory module (DIMM), in order to locate the cause of the failure. Usually responsible for the failure of a memory chip which cannot be properly read from or written to are ruptured soldered connections between the memory chip and the printed circuit board of the memory module.

Until now, the cause has been traced by visual inspection of the existing soldered joints of the address pin contacts. Alternatively, pin contacts selected on a sample basis and suspected of having a ruptured contact connection to the assigned address line of the printed circuit board are re-soldered.

Both methods are time-consuming and only conditionally reliable.

In principle, interrupted electrical connections between the address lines of the printed circuit board and the address line contacts of a semiconductor memory chip can also be traced electrically, in that voltage drops under a constant current are measured or currents under applied voltages are measured. In the case of memory modules with a number of memory chips, for example 8 or 16, the address line contacts of which are connected in parallel by the connected address lines, such tests do not work. Since each address line is connected to each of the memory chips via a pin contact, the created test circuit is closed even when the contact to one of the memory chips is interrupted, by the functioning contact connections to the other memory chips, whereby faultless functioning is indicated in spite of ruptured solder contacts.

SUMMARY OF THE INVENTION

It is accordingly an object of the invention to provide a method of checking electrical connections between a memory module and a semiconductor memory chip that overcomes the above-mentioned disadvantages of the prior art methods of this general type, which is more reliable and less time-consuming and which works irrespective of the number of semiconductor chips mounted on the printed circuit board.

With the foregoing and other objects in view there is provided, in accordance with the invention, a method for checking a functional capability of electrical connections between address lines of a printed circuit board of a memory module and address line contacts of an integrated semiconductor memory chip mounted on the printed circuit board. Memory cells of the integrated semiconductor memory chip being selected by the address lines being electrically biased in a specific manner. The method includes checking the functional capability of the electrical connections by accessing the integrated semiconductor memory chip through writing and reading operations. The accessing step includes the steps of:

a) writing a first item of information to a first memory cell selected by none of the address lines being electrically biased;

b) writing a second item of information differing from the first item of information to a second memory cell selected by electrically biasing only a single address line;

c) reading from the integrated semiconductor memory chip with the first memory cell being selected by none of the address lines being electrically biased; and d) checking whether the first item of information or the second item of information was read out.

A sequence of the steps a) to d) is then repeated a number of times and, with each repetition of the sequence of the steps a) to d), a different one of the address lines being electrically biased as the single address line during step b).

According to the invention, a specifically constructed memory test is used instead of an electrical resistance measurement to identify interrupted soldered connections. The invention is based on considerations as to how a semiconductor chip with partly damaged solder contacts reacts when writing and reading operations are initiated. In the case of defective solder contacts, they do not produce usable results in normal memory operation, but are used according to the invention to identify interrupted contact connections.

In a memory module, the memory addresses (cells) of a semiconductor memory chip are selected via address lines which can be electrically biased individually, independently of one another, and as a result, route a binary-coded address to that memory cell which is to be selected in a writing or reading operation. The address lines are connected to pin contacts of the semiconductor memory chip, which has in addition further pin contacts for control lines, data lines or clock lines. The data lines are used for transporting the data to be stored or to be read; the control lines and clock lines serve for making the memory chip operate properly. The address lines are used for transmitting the memory addresses into which the items of memory information transmitted by the data lines are written or from which they are read.

The invention is based in particular on the idea that, if one or more solder contacts are damaged, even though the memory address to be selected is no longer selected, a different memory address is accessed instead. The invention makes use of the fact that, in the event of a defective solder contact, an electrical biasing voltage that is applied to the address line concerned cannot be passed on. Since the electrical potential of the assigned pin contact of the memory chip is "floating", the semiconductor chip registers with great probability a grounded address line, whereby, in conjunction with the voltage values of the remaining address lines, a different memory address than the one desired is selected. In normal memory operation, this perception is of no further assistance, since it is unknown which of the usually 14 address line contacts is defective.

According to the invention, however, use is made of the fact that in the semiconductor memory chip there is a single memory address which is always selected if the solder contacts of all the address lines or at least of all the electrically biased address lines are interrupted. The binary digit of this memory address is exclusively made up of "0" digital bits. Access to this memory address is used according to the invention to test the contact of a specific address line.

According to the invention, in step a), a first item of information, for example a digital "1", is written into the memory address by none of the address lines being electrically biased. This makes use of the fact that, in the event of interrupted solder contacts, the corresponding contact pins of the memory chip are at a floating potential and consequently are with great probability grounded, so that even in the event of defective solder contacts precisely this memory address is selected. In step b), a different second item of information, for example a digital "0", is written, the memory address now to be selected being selected by only a single address line being electrically biased. Subsequently, in step c), the first memory address is again selected and read from. In step d), it is checked whether this involved reading the item of information stored in step a) or the item of information stored in step b).

If the address line contact to be checked is working, in step b) the different second item of information is written into a different memory address than in step a). In step c), the first item of information stored in step a) is then read out again. If the contact to be checked is interrupted, however, in step b) the second memory address to be selected cannot be selected. Instead of this, since the pin contact does not register an electrical biasing voltage, the second item of information is likewise written into the first memory address. The item of information written in step a) is therefore overwritten in step b) by the second item of information, which is read out in step c). This unexpected memory value indicates a defect of the checked contact connection.

In this way, defective solder contacts can be located by operating the memory on a test basis. The series of steps a) to d) is repeated a number of times, and with each repetition a different address line is electrically biased as the single address line during steps b) and c).

With the foregoing and other objects in view there is further provided, in accordance with the invention, a method for checking a functional capability of electrical connections between address lines of a printed circuit board of a memory module and address line contacts of an integrated semiconductor memory chip mounted on the printed circuit board. Memory cells of the integrated semiconductor memory chip being selected by the address lines being electrically biased in a specific manner. The method includes checking the functional capability of the electrical connections by accessing the integrated semiconductor memory chip through writing and reading operations. The accessing step includes:

a) writing a first item of information to a first memory cell selected by only a single address line being electrically biased;

b) writing a second item of information, differing from the first item of information, to a second memory cell selected by none of the address lines being electrically biased;

c) executing a read command, a same address line as in step a) being electrically biased as the single address line; and d) checking whether the first item of information or the second item of information was read out.

A sequence of the steps a) to d) is repeated a number of times and, with each repetition of the sequence of the steps a) to d), a different address line being electrically biased as the single address line during step a).

In the case of this method, in step a) the memory address which requires electrical biasing of the address line concerned is selected first. In step b), on the other hand, writing takes place to the memory address selected with address lines at ground potential. In step c), the address selected in step a) is in turn accessed. Depending on whether or not the pin contact of the address line to be tested is connected, in steps a) and c) the address from step b) is actually selected instead of the address to be selected.

If the address line contact is working, in step a) the first item of information, for example a digital "1", is written into the first address to be selected. In step c), which in turn successfully accesses this address, this item of information is read out again. The writing operation in step b) in this case has no effect.

If, however, the address line contact is interrupted, in steps a) and c) the second memory address from step b), which does not depend on electrical biasing, is selected instead of the first memory address to be selected, which depends on electrical biasing. Then, in step a), the first item of information is written into this second memory address; in step b), this item of information is overwritten by the different second item of information, which is subsequently read out in step c) instead of the expected first item of information.

Therefore, even in the case of the method according to the invention, the reading out of the second item of information instead of the first item of information indicates a defective contact connection of the tested address line.

With the aid of the two methods according to the invention, it is possible to locate a defective solder contact (or bonding contact or contact established in some other way) by a customary memory access. As a result, neither unplanned electrical measurements nor optical examinations are required. The methods according to the invention are more reliable and less time-consuming than the conventional methods and also work in the case of memory modules with a number of memory chips, the pin contacts of which are connected in parallel via the address lines and are consequently short-circuited with respect to one another, since in the course of normal memory operation, which is used according to the invention, the control signals transmitted via the control lines ensure that a single memory chip is selectively accessed during writing or reading.

It is preferably provided that the series of steps a) to d) is carried out as often as corresponds to the number of address lines of the semiconductor chip, so that each address line is checked during precisely one instance of carrying out of the series of steps a) to d) for the functional capability of its electrical connection to an address line contact. In this way, the conducting connection of each address line to the respectively assigned address line contact is successively checked.

It is preferably provided that, whenever the check in step d) shows that the second item of information has been read out, an interruption of the electrical connection between that address line which has been electrically biased as the single address line and the assigned address line contact of the semiconductor memory chip is reported. If, in step c), the second item of information is read out, although step c) accesses the same memory address as step a), the first item of information written in step a) must have been overwritten by the second item of information, which is only possible if the electrical biasing has been blocked on account of a defective address line contact.

The first item of information is preferably a digital data bit and the second item of information is the digital data bit that is inverse to the first data bit. The first and second items of information are a digital "0" and "1", or vice versa.

A preferred embodiment provides that the address lines are operated by the multiplexing technique, in which the word line address and the bit line address of a memory address to be selected are selected one after the other by specific electrical biasing of the address lines. The memory addresses (cells) of a semiconductor chip are disposed in rows (bit lines) and columns (word lines). Their addresses are specified by two multi-digit binary numbers, denoted here as x and y. In the control of the semiconductor chip, each time a memory address is selected, first its bit line address and then its word line address is transmitted via the address lines, or vice versa. Therefore, those three memory addresses for which the address line to be checked is electrically biased only when transmitting the bit line address or only when transmitting the word line address or is electrically biased when transmitting both addresses can be used as the memory address of which the selection depends on the electrical biasing of precisely one address line.

It is preferably provided that that address line which is electrically biased as the single address line during the sequence of steps a) to d) is biased only when selecting bit line addresses. The electrical biasing has the effect that, in step b) in the first method according to the invention and in steps a) and c) in the second method, a memory address assigned to the biased bit line is accessed as long as the electrical connection is closed. In the case that a semiconductor memory has more bit lines than word lines, the bit line addresses are longer and, by contrast with the word lines, are transmitted by a relatively large number of address lines. If, in the case of this embodiment, the electrical biasing voltage is applied only during the selection of the bit line, more address lines can be checked than in the case of biasing when selecting word lines. Generally, electrical biasing is applied during selection of that address line type which has more address lines, e.g. the X-addresses. The X-addresses include all word line addresses plus the addresses for the memory banks.

With the method according to the invention, precisely one single address line is tested in each case. To test a number of address lines, and possibly all of them, a development of the invention provides that the sequence of steps a) to d) is repeated, a different address line being electrically biased with each repetition of the sequence.

Another development provides that a memory module which has a number of semiconductor chips on the printed circuit board, the address line contacts of which are connected in parallel by the address lines of the printed circuit board, is tested by a control signal being used to select a single semiconductor chip of which the memory addresses are exclusively accessed during steps a) to d). In this way it is possible to test one after the other a number of memory chips connected in parallel by the address lines, for which a resistance measurement fails on account of the short-circuited, parallel-connected pin contacts.

A development of the invention provides that electrical biasing voltages of the address lines are used to set an operating mode for checking the electrical connections which determines the type of data transmission between the printed circuit board and the semiconductor memory chip, the operating mode that is set being one which requires only a single address line to be electrically biased for its setting. If one or more address line contacts are interrupted, the semiconductor memory chip no longer functions properly, which is equivalent to total failure. The test mode used according to the invention, in which however selected memory addresses are specifically accessed, must first be set before the test can be carried out. This initialization also requires setting of the manner and methods by which data are to be transported into the memory addresses or taken from them. This setting also requires the activation, i.e. electrical biasing, of address lines. Since, however, some of these may be interrupted, it is advantageous to choose a manner of transmission which requires only a single address line to be biased for its setting.

It is preferably provided that the number of data bits transmitted one after the other per write command or read command, their sequence and/or the length of a delay time between the access to a word line during reading and the transmission of read data bits are set by the set operating mode in such a way that the same address line is biased for each setting. For example, what is known as the burst length is set to "1" and the sequence of data to be transmitted with a bus width of 4 bits is fixed as 1-2-3-4 ("sequential burst type"). The "column address strobe latency", which specifies the delay time between the opening of a word line and the reading out of an item of information from a specific bit line crossing the word line, is fixed, for example, at two clock units. All three settings merely require the biasing of the same address line, so that all the other address lines can be tested.

Other features which are considered as characteristic for the invention are set forth in the appended claims.

Although the invention is illustrated and described herein as embodied in a method of checking electrical connections between a memory module and a semiconductor memory chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
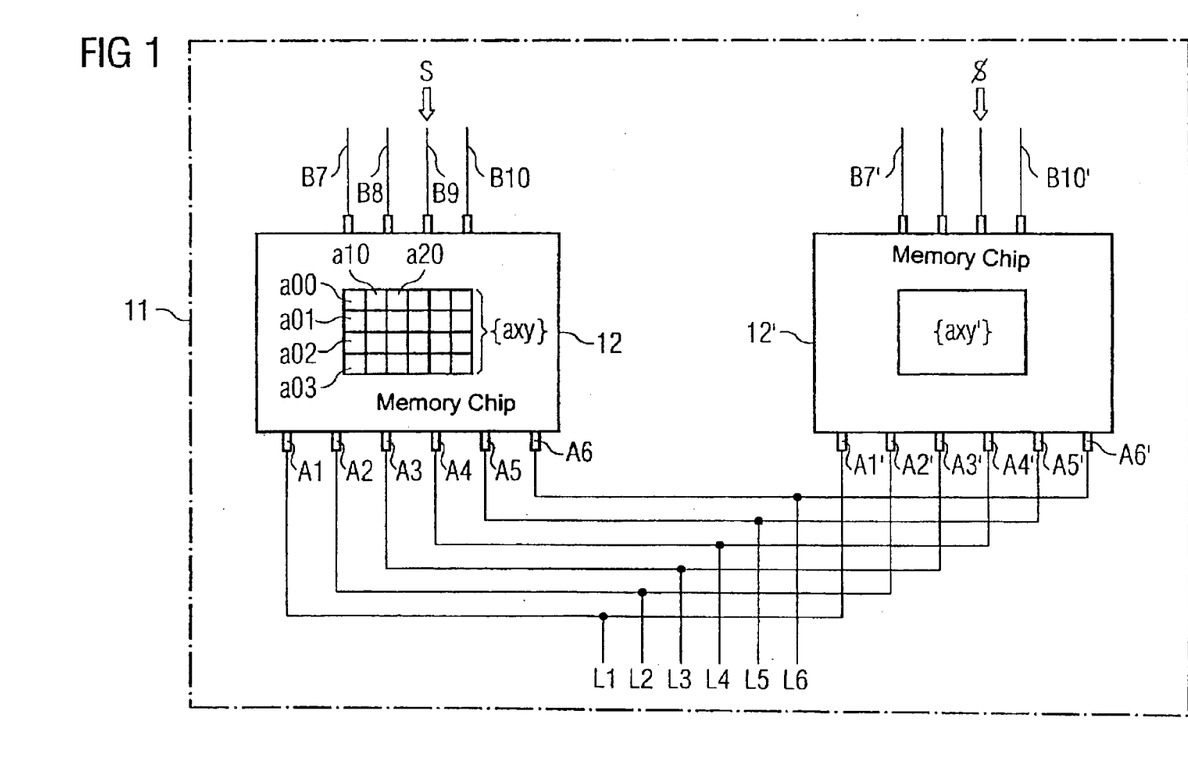
FIG. 1 is a block diagram of a memory module to be tested.

Referring now to the figures of the drawing in detail and first, particularly, to FIG. 1 thereof, there is shown a memory module with an electronic printed circuit board 11, on which two integrated semiconductor memory chips 12 and 12' are mounted. Each memory chip contains an integrated semiconductor chip, a chip frame, and a multiplicity of electrical contacts A1, . . . , A6, B7, . . . , B10; A1', . . . , A6', B7', . . . , B10'. The contacts denoted by Ai (in practice 14 per memory chip) are each connected, for example soldered or bonded, to an address line L1, . . . , L6. Further contacts, denoted by B, serve for connecting to data lines (input/output lines), control lines and clock lines. The address lines L1, . . . , L6 are used for short-circuiting the address line contacts of various memory chips A1, A1'; . . . ; A6, A6' to one another, so that, for example in the case of an interrupted contact between the address line L3 and the contact A3 of one memory chip 12, the defect cannot be detected by a resistance measurement, because the parallel-connected contact A3' of the further memory chip 12' establishes a conductive connection. Therefore, conventional resistance tests fail. In the case of the method according to the invention, on the other hand, the parallel connection of a number of memory chips is not harmful, because the memory data transported for example via input/output lines B7, B8, B7', B8' are not transported via the address lines and, moreover, a specific memory chip 12 is selected by a corresponding control signal S, which is present for example at the control contact B9.

As schematically represented by the example of the memory chip 12, the integrated semiconductor memories are disposed in rows and columns and are connected by word lines and bit lines. In FIG. 1, a second digit x of a memory address axy specifies its word line address and the third digit of the memory address axy specifies its bit line y. The variables x and y correspond to multi-digit binary numbers, the binary number y being greater on account of the high number of bit lines (typically 1024). The memory module is, for example, a dual inline memory module (DIMM), which is provided with 8 or 16 semiconductor memory chips.

Figure 2A:
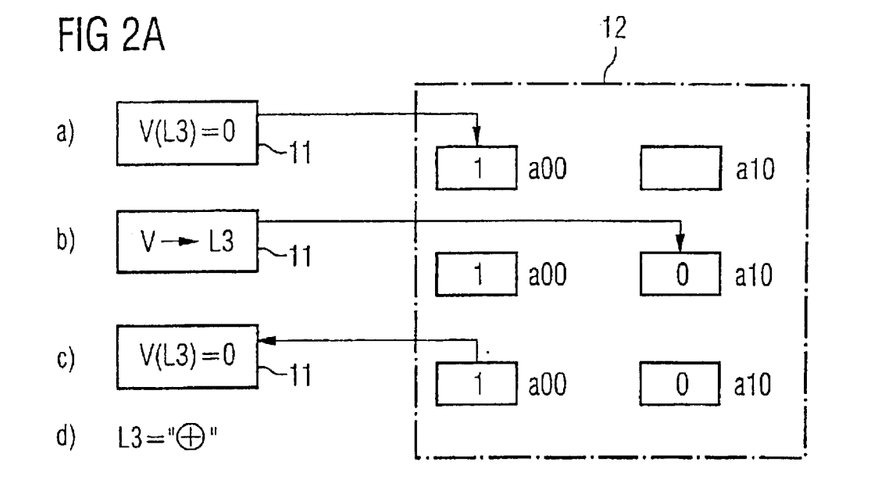
FIGS. 2A and 2B are block diagrams showing the functional principle of a first method according to the invention in the case of a functioning address line contact and a defective address line contact.

FIG. 2A schematically shows the sequence and operating principle of a first method according to the invention in the case of a functioning address line contact to be checked. In step a), an item of information "1" is written from the printed circuit board 11 via corresponding data lines into a memory address a00. The data lines that transport the item of information are not represented. The address lines that route the bit into the memory address a00 are not represented.

In step a), none of the address lines are biased, so that the digital data bit "1" is written into the memory address a00.

In step b), the opposite data bit "0" is written. The opposite bit is written into a different cell, in that exclusively the address line L3 of the memory chip 12 is electrically biased (i.e. an electrical potential of a corresponding address line data bit is connected). The memory address selected in this way is assumed, for example, to be a10. As long as the address line L3 is connected in a conducting manner to the address line contact A3 of the memory chip, the data value "0" is written into the memory address a10.

In step c), the address a00 is selected, in that in turn none of the address lines are electrically biased (or all the address lines are connected to a ground potential), so that the memory address a00 is read out. The first-stored data bit "1", present as before in this address, indicates in step d) a satisfactory connection between the address line L3 and the associated contact A3.

Figure 2B:
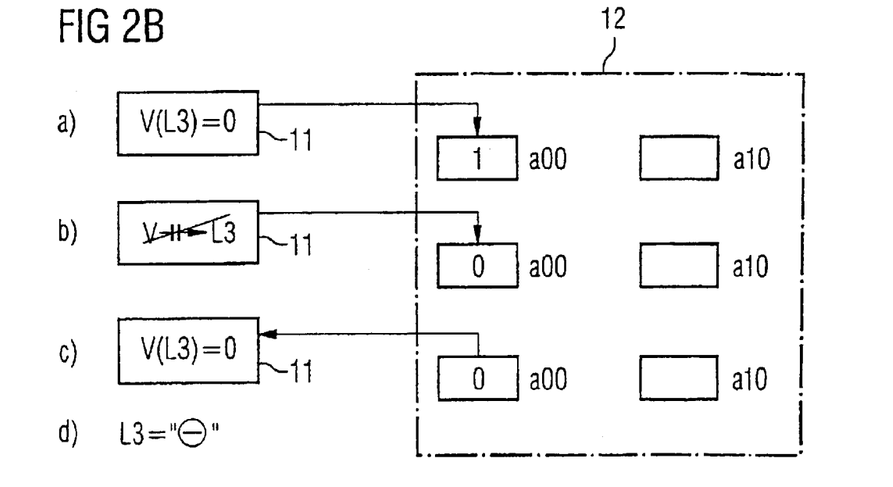

If, however, the contact is interrupted, the semiconductor memory chip reacts in the way represented in FIG. 2B. Step a) proceeds in the same way as in FIG. 2A. In step b), however, since the address line L3 is not contacted, the biasing potential applied to the line is not detected by the memory chip, for which reason the memory chip reacts as though a biasing voltage were not connected to any of the address lines, and therefore selects the memory address a00. The data bit "0" written in step b) is routed to the memory address a00 instead of to the memory address a10 and overwrites the data bit "1" written in step a). In step c), therefore, not the original data bit "1" but the data bit "0" is read, which in step d) indicates a defective contact L3.

Figure 2C:
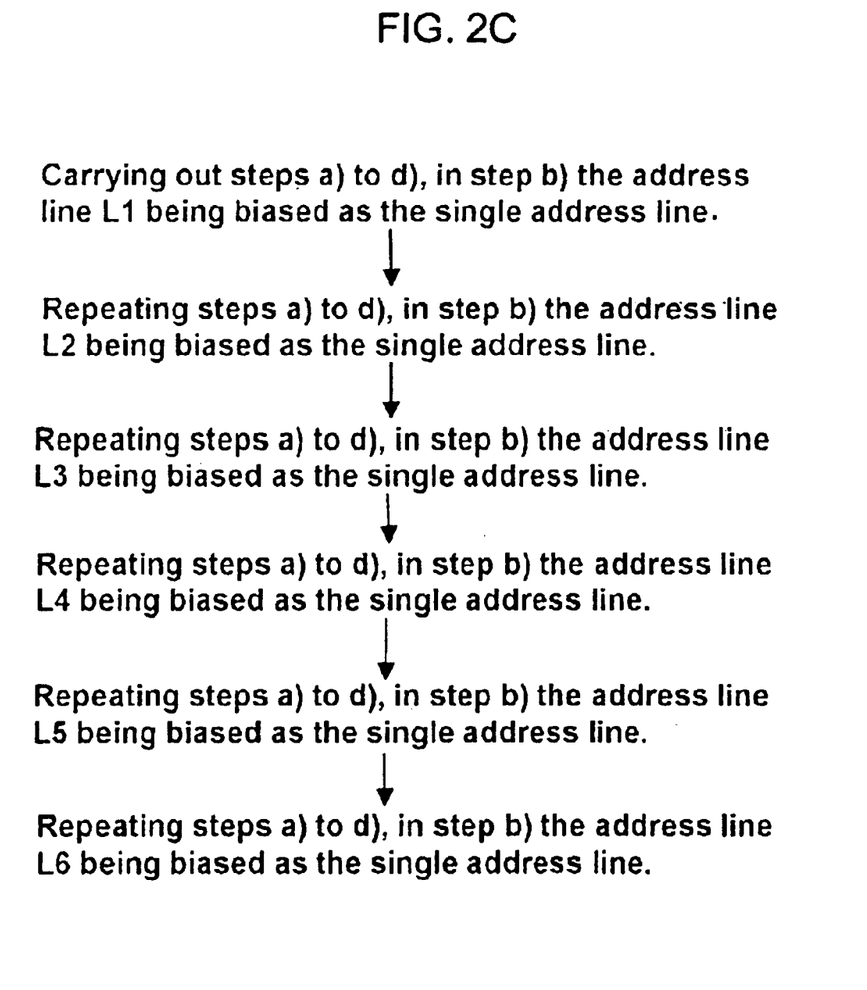
FIG. 2C is a flow diagram of the first method according to the invention.

According to the invention, the steps a) to d) described above are repeated as often as it takes to test each address line. With every repetition of the sequence of steps a) to d), the memory module reacts either in the way represented in FIG. 2A or in the way represented in FIG. 2B, depending on whether the contact to the address line concerned is defective or intact. In the case of FIG. 2C, a memory module with 6 address lines is tested, the address line L1 being biased in step b) as the single address line during the first instance of carrying out steps a) to d). With the first repetition, the address line L2 is biased as the single address line in step b) and, with every further repetition of the series of steps, a further address line L3, L4, L5, L6 is tested. With each repetition of the series of steps, a different memory address a10, a20, a30, a40, a50, a60 is accessed in the respective step b).

Figure 3A:
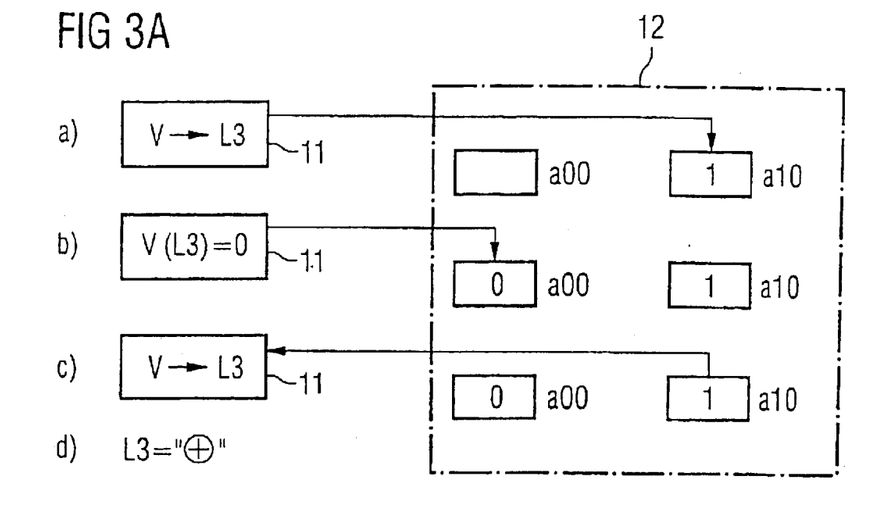
FIGS. 3A and 3B are block diagrams showing the functional principle of a second method according to the invention in the case of a functioning address line contact and a defective address line contact.

FIG. 3A shows the reaction of the memory chip in the case of a second method according to the invention in the case of satisfactory address line contacts. In the case of this method, first, in step a), a data bit is written into a first memory address a10 of the kind which requires electrical biasing of precisely one address line (for example L3) for its selection. A first data bit "1" is written into the memory address. In step b), the electrical biasing of the address line L3 is discontinued, so that now no address line is biased any longer. As a result, the data bit "0", which is the complement of the first data bit "1", is then routed into the memory address a00. In step c), the address line L3 is again electrically biased, so that reading takes place from the memory address a10; the original data bit "1" signals in step d) a satisfactory contact to the address pin A3.

Figure 3B:
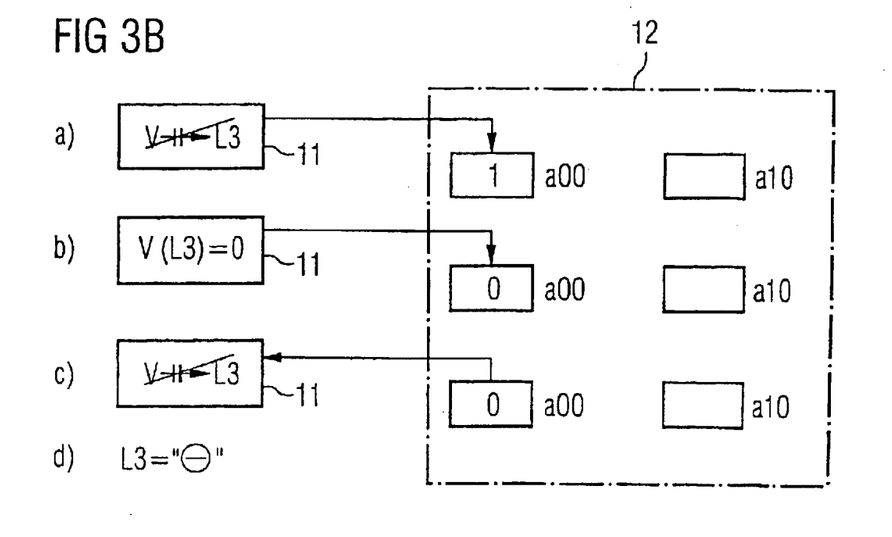

If the contact is interrupted, the semiconductor chip 12 reacts in the way represented in FIG. 3B. In step a), the data bit "1" is written into the memory address a00 instead of into a10, on account of the interrupted contact. In step b), the data bit is overwritten by the complementary data bit "0". If, in step c), a read command is executed, and the memory address a10 is again selected by the electrical biasing on the address line L3, the memory chip routes the read command to the memory address a00, on account of the interrupted contact, so that the inverted data bit "0" is read out from there and a defective contact is indicated in step d).

Figure 3C:
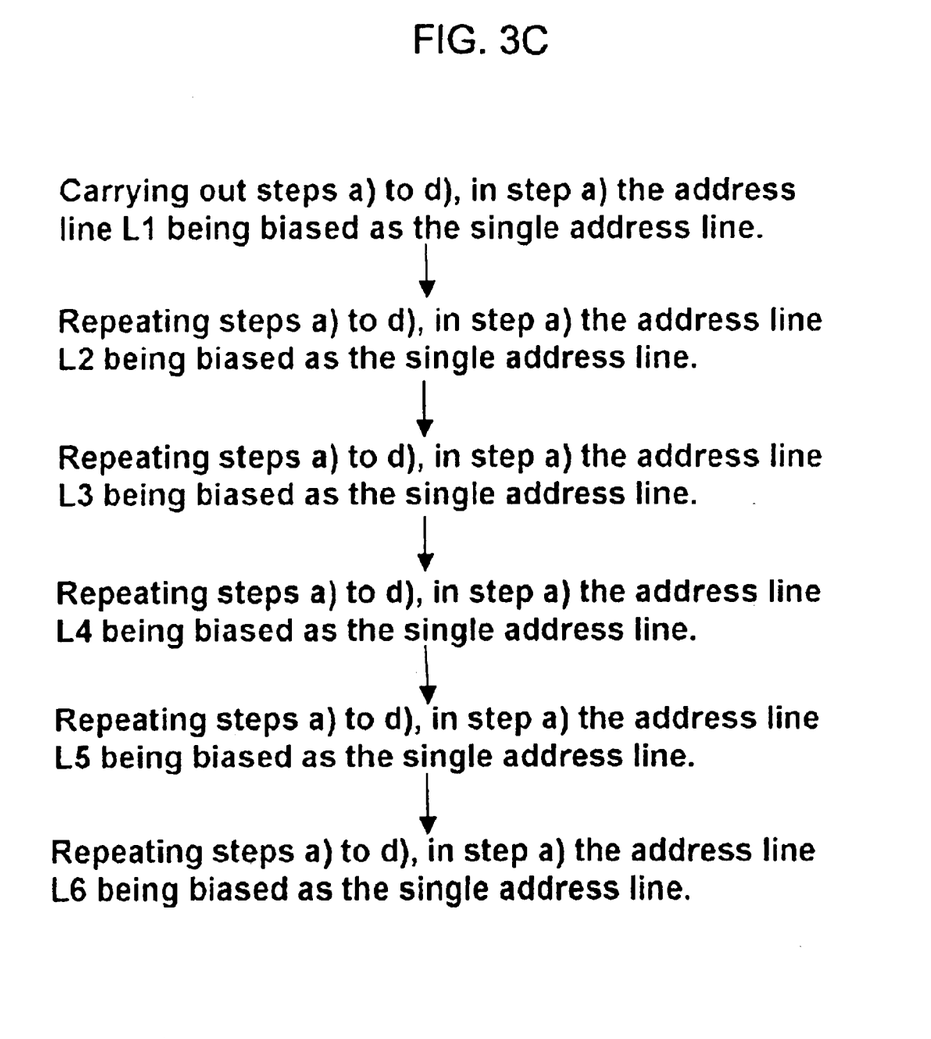
FIG. 3C is a flow diagram of the second method according to the invention.

According to the invention, the steps a) to d) described above are repeated as often as it takes to test each address line. With every repetition of the sequence of steps a) to d), the memory module reacts either in the way represented in FIG. 3A or in the way represented in FIG. 3B, depending on whether the contact to the address line concerned is defective or intact. In the case of FIG. 3C, a memory module with 6 address lines is tested, the address line L1 being biased in step a) as the single address line during the first instance of carrying out steps a) to d). With the first repetition, the address line L2 is biased as the single address line in step a) and, with every further repetition of the series of steps, a further address line L3, L4, L5, L6 is tested. With each repetition of the series of steps, a different memory address a10, a20, a30, a40, a50, a60 is accessed in the respective step a).

The indeterminable misrouting of write and read commands in normal memory operation is used according to the invention to obtain information on the occurrence and position of interrupted solder contacts. The restriction according to the invention to the biasing of only a single address line at each point in time makes it possible to determine the location of the misrouting. The way in which the invention links up write and read accesses to a memory address which is selected whenever precisely one specific address line is biased and to that memory address which is selected whenever all the address lines are grounded makes it possible to obtain a definitive indication of the presence of a contact interruption between an address line and an address line contact. Use is made of the misrouting of write or read commands in method step b) in a first method according to the invention and as shown in FIGS. 2A and 2B, and in method steps a) and c) in a second method as shown in FIGS. 3A and 3B.

Figure 4:
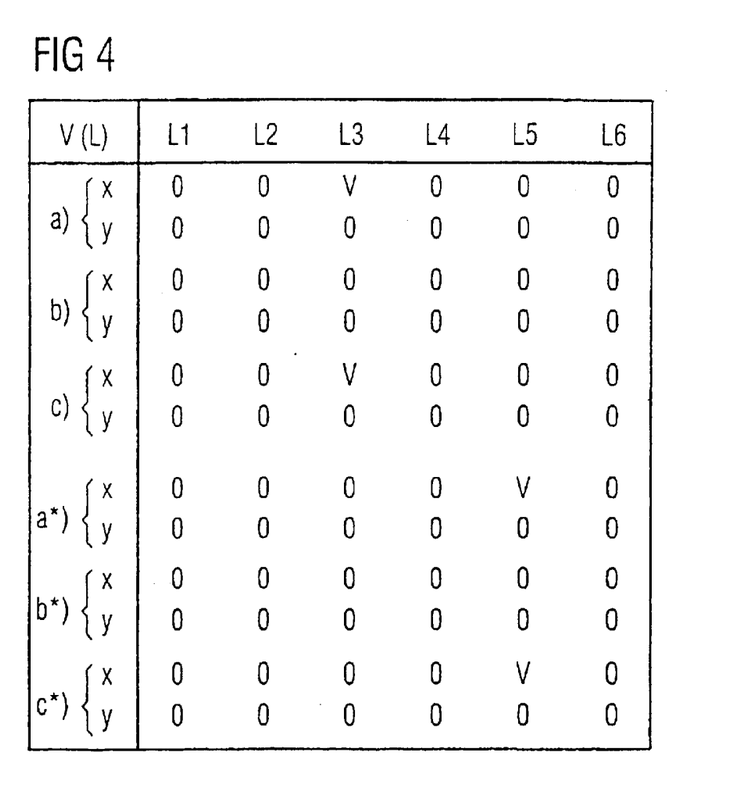
FIG. 4 is a table showing an embodiment using a multiplexing technique.

In practice, a memory address axy, which is made up of a word line address y and a bit line address x, is transmitted via the address lines in two steps. FIG. 4 shows an example of such a transmission by the multiplexing technique on the basis of the second method according to the invention by the example of FIG. 3A. A memory address which requires for its selection only biasing during the selection of the bit line x is expediently chosen for the multiplexing technique. A semiconductor memory has a high number of bit lines, so that the bit line address has many binary places, which require a correspondingly high number of address lines.

According to FIG. 4, in step a) the address line L3 is provided with a biasing voltage V only during the selection of the bit line. In the selection of the word line, on the other hand, the address line L3 is again connected to ground. As a result, the first item of information to be written in step a), for example the digital data bit "1", is routed to the assigned memory address a10. In this example, the memory address a10 is precisely that address which is selected when only the address line L3 is biased, and this also only during the selection of the bit lines. The selection of the memory address a10 in step c) proceeds as in step a). Depending on whether in step c) the first data bit "1", written in step a), or the inverse second data bit "0", written in step b), is read, a satisfactory or defective address line contact on the address line L3 is indicated. In this case, it is immaterial whether the first data bit is "1" and the second data bit is "0" or vice versa.

To test further address line contacts, for example that on the address line L5, the sequence of steps a) to d) is repeated, the address line L5 expediently being biased in the same way as the address line L3.

Figure 5:
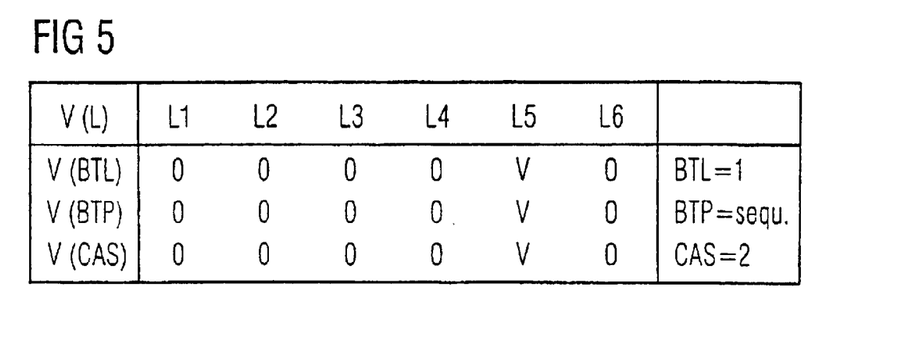
FIG. 5 is a table showing a further embodiment with respect to the initialization of an operating mode for executing the method according to the invention.

FIG. 5 shows how the address lines can be biased at the beginning of the method according to the invention, in order to switch the memory chip into a corresponding operating mode. Today, memory chips require mode register commands by which the manner of access during writing and reading is fixed. For the method according to the invention, a manner of transmission that can be set with only a single electrically biased address line L5 is preferably chosen. The parameters which are fixed by the set operating mode are the number of data bits transmitted one after the other per write or read command, i.e. what is known as the burst length, which is "1" here and means that all the data are transmitted during a single clock cycle; for example, in the case of a bus width of 4, four data simultaneously. A further parameter that can be set is the sequence in which the data are distributed among the data lines of the data bus. In the case of this "sequential" burst type, as it is known, a number of data 1, 2, 3, 4 are transmitted in this sequence alongside one another via the corresponding 4 data lines. Finally, the column address strobe (CAS) latency can be set, i.e. the duration of the time delay between the access to a bit line during execution of the read command and the transmission of the data bits read. The CAS latency is, for example, two clock times. In the case of a commercially available semiconductor memory chip 12, on which this example has been based, the CAS latency can be set as "2", the burst length as "1" and the burst type as "sequential", all with a biasing exclusively of the fifth address line. Therefore, the associated contact connection on all the other address lines can be tested.

The invention makes it possible for the conductivity at pin contacts to be measured by the indirect method of a functional conductivity test, i.e. carried out with the aid of write and read commands, i.e. memory use in a test mode. On account of the electrical biasing of only one address line in each case, reliable locating of interrupted contacts to address pins of the memory chip is achieved.

We claim:

1. A method for checking a functional capability of electrical connections between address lines of a printed circuit board of a memory module and address line contacts of an integrated semiconductor memory chip mounted on the printed circuit board, memory cells of the integrated semiconductor memory chip being selected by the address lines being electrically biased in a specific manner, which comprises the steps of:

checking the functional capability of the electrical connections by accessing the integrated semiconductor memory chip through writing and reading operations, the accessing step includes the steps of:

a) writing a first item of information to a first memory cell selected by none of the address lines being electrically biased;

b) writing a second item of information differing from the first item of information to a second memory cell selected by electrically biasing only a single address line;

c) reading from the integrated semiconductor memory chip with the first memory cell being selected by none of the address lines being electrically biased; and d) checking whether the first item of information or the second item of information was read out; and repeating a sequence of the steps a) to d) a number of times and, with each repetition of the sequence of the steps a) to d), a different one of the address lines being electrically biased as the single address line during step b).

2. The method according to claim 1, which comprises carrying out the sequence of the steps a) to d) as often as corresponds to a number of the address lines of the integrated semiconductor memory chip, so that each of the address lines is checked during precisely one instance of carrying out the sequence of the steps a) to d) for the functional capability of an electrical connection to a respective address line contact.

3. The method according to claim 1, which comprises reporting an interruption of an electrical connection between an address line which has been electrically biased as the single address line and an assigned address line contact of the integrated semiconductor memory chip if step d) shows that the second item of information has been read out.

4. The method according to claim 1, which comprises using a first digital data bit as the first item of information and a second digital data bit as the second item of information, the second digital data bit being inverse to the first digital data bit.

5. The method according to claim 1, which comprises operating the address lines using a multiplexing technique, in the multiplexing technique a word line and a bit line of a memory cell to be selected can be selected one after another by specific electrical biasing of the address lines.

6. The method according to claim 5, which comprises biasing the address line which is electrically biased as the single address line during the sequence of the steps a) to d) only when selecting the bit line address.

7. The method according to claim 1, wherein the memory module has a plurality of integrated semiconductor memory chips disposed on the printed circuit board, the address line contacts of the integrated semiconductor memory chips being connected in parallel by the address lines of the printed circuit board, which further comprises the step of:

using a control signal to select a single one of the integrated semiconductor memory chips for testing.

8. The method according to claim 1, which comprises using electrical biasing voltages of the address lines to set an operating mode for checking the electrical connections, the operating mode determining a type of data transmission between the printed circuit board and the integrated semiconductor memory chip, the operating mode being one which requires only a single address line to be electrically biased for its setting.

9. The method according to claim 8, which comprises using the operating mode for setting a number of data bits transmitted one after another per write command or read command, a sequence of the data bits, and a length of a delay time between an access to a word line during reading and a transmission of read data bits, in such a way that a same address line is biased for each setting.

10. A method for checking a functional capability of electrical connections between address lines of a printed circuit board of a memory module and address line contacts of an integrated semiconductor memory chip mounted on the printed circuit board, memory cells of the integrated semiconductor memory chip selected by the address lines being electrically biased in a specific manner, which comprises the steps of:

checking the functional capability of the electrical connections by accessing the integrated semiconductor memory chip through writing and reading operations, the accessing step includes:

a) writing a first item of information to a first memory cell selected by only a single address line being electrically biased;

b) writing a second item of information, differing from the first item of information, to a second memory cell selected by none of the address lines being electrically biased;

c) executing a read command, a same address line as in step a) being electrically biased as the single address line; and d) checking whether the first item of information or the second item of information was read out; and repeating a sequence of the steps a) to d) a number of times and, with each repetition of the sequence of the steps a) to d), a different address line being electrically biased as the single address line during step a).

11. The method according to claim 10, which comprises carrying out the sequence of the steps a) to d) as often as corresponds to a number of the address lines of the integrated semiconductor memory chip, so that each of the address lines is checked during precisely one instance of carrying out the sequence of the steps a) to d) for the functional capability of an electrical connection to a respective address line contact.

12. The method according to claim 10, which comprises reporting an interruption of an electrical connection between an address line which has been electrically biased as the single address line and an assigned address line contact of the integrated semiconductor memory chip if step d) shows that the second item of information has been read out.

13. The method according to claim 10, which comprises using a first digital data bit as the first item of information and a second digital data bit as the second item of information, the second digital data bit being inverse to the first digital data bit.

14. The method according to claim 10, which comprises operating the address lines using a multiplexing technique, in the multiplexing technique a word line and a bit line of a memory cell to be selected can be selected one after another by specific electrical biasing of the address lines.

15. The method according to claim 14, which comprises biasing the address line which is electrically biased as the single address line during the sequence of the steps a) to d) only when selecting the bit line address.

16. The method according to claim 10, wherein the memory module has a plurality of integrated semiconductor memory chips disposed on the printed circuit board, the address line contacts of the integrated semiconductor memory chips being connected in parallel by the address lines of the printed circuit board, which further comprises the step of:

using a control signal to select a single one of the integrated semiconductor memory chips for testing.

17. The method according to claim 10, which comprises using electrical biasing voltages of the address lines to set an operating mode for checking the electrical connections, the operating mode determining a type of data transmission between the printed circuit board and the integrated semiconductor memory chip, and the operating mode being one which requires only a single address line to be electrically biased for its setting.

18. The method according to claim 17, which comprises using the operating mode for setting a number of data bits transmitted one after another per write command or read command, a sequence of the data bits, and a length of a delay time between an access to a word line during reading and a transmission of read data bits, in such a way that a same address line is biased for each setting.

* * * * *